United States Patent
Matero et al.

(10) Patent No.: US 7,551,688 B2
(45) Date of Patent: Jun. 23, 2009

(54) WAVEFORMS FOR ENVELOPE TRACKING TRANSMITTER

(75) Inventors: Jorma Matero, Oulu (FI); Jarkko Kesti, Oulunsalo (FI)

(73) Assignee: Nokia Corporation, Espoo (FI)

( * ) Notice: Subject to any disclaimer, the term of this patent is extended or adjusted under 35 U.S.C. 154(b) by 1527 days.

(21) Appl. No.: 10/127,340

(22) Filed: Apr. 18, 2002

(65) Prior Publication Data

US 2003/0198300 A1 Oct. 23, 2003

(51) Int. Cl.
- H04L 27/00 (2006.01)
- H04L 25/03 (2006.01)
- H04B 1/04 (2006.01)

(52) U.S. Cl. .................. 375/297; 375/295; 375/296; 455/114.3; 455/127.1; 455/127.2; 330/199

(58) Field of Classification Search .................. 455/91, 455/127, 108, 115.1, 127.1, 126, 115, 129, 455/136, 13.4, 63, 93, 102, 117, 139, 149, 455/256.1, 245, 127.2, 114, 114.3; 330/129, 330/149, 199, 136, 285, 297, 260, 100, 200, 330/124, 151, 51, 91, 127; 375/295–297, 375/298, 345; 333/213–214

See application file for complete search history.

(56) References Cited

U.S. PATENT DOCUMENTS 5,847,602 A * 12/1998 Su .............................. 330/10
5,854,971 A * 12/1998 Nagoya et al. .............. 455/126

(Continued)

OTHER PUBLICATIONS

"High-efficiency power amplifier using dynamic power-supply voltage for CDMA applications" Hanington, G.; Pin-Fan Chen; Asbeck, P.M.; Larson, L.E.;Microwave Theory and Techniques, IEEE Transactions on vol. 47, Issue 8, Aug. 1999 pp. 1471-1476.*

(Continued)

*Primary Examiner*—Mohammad H Ghayour
*Assistant Examiner*—Sophia Vlahos
(74) *Attorney, Agent, or Firm*—Ware, Fressola, Van Der Sluys and Adolphson, LLP

(57) ABSTRACT

A method and device for improving the efficiency of an envelope tracking transmitter in which a power amplifier for coupling modulated signals in a carrier frequency to an antenna for transmission. The transmitter comprises a power supply for providing a supply voltage to the power amplifier, and a computation means for providing a waveform indicative of the envelope of the modulated signal to the power supply in order to modify the supply voltage. A lower limit is imposed to the waveform so that the supply voltage to the power supply is always greater than a predetermined value. Moreover, when information is transmitted in times slots which are started and ended by ramp periods, a constant signal, based on the root-mean-square value of the waveform, is used to modify the waveform so that the supply voltage to the power amplifier includes a constant voltage level in the ramp periods.

17 Claims, 5 Drawing Sheets

U.S. PATENT DOCUMENTS

| | | | | |
|---|---|---|---|---|
| 6,006,075 | A * | 12/1999 | Smith et al. | 455/101 |
| 6,043,707 | A * | 3/2000 | Budnik | 330/10 |
| 6,084,468 | A * | 7/2000 | Sigmon et al. | 330/136 |
| 6,141,541 | A * | 10/2000 | Midya et al. | 455/91 |
| 6,161,024 | A * | 12/2000 | Komara | 455/562.1 |
| 6,215,988 | B1 * | 4/2001 | Matero | 455/188.1 |
| 6,242,975 | B1 * | 6/2001 | Eidson et al. | 330/124 R |
| 6,256,482 | B1 * | 7/2001 | Raab | 455/108 |
| 6,275,103 | B1 * | 8/2001 | Maniwa | 330/149 |
| 6,438,360 | B1 * | 8/2002 | Alberth et al. | 455/110 |
| 6,529,716 | B1 * | 3/2003 | Eidson et al. | 455/115.1 |
| 6,531,917 | B2 * | 3/2003 | Yamamoto et al. | 330/149 |
| 6,580,901 | B1 * | 6/2003 | Mochizuki | 455/127.1 |

OTHER PUBLICATIONS

"Microelectronic Circuits" Sedra/Smith Fourth Edition, oxford University Press, p. 367.*

"Microwave Power Amplifiers With Digitally-Controlled Power Supply Voltage for High Efficiency and High Linearity"; M. Ranjan et al.; IEEE MTT-S International Microwave Symposium Digest, pp. 493-492, vol. 2. Jun. 2000.

"Hihg-Efficiency Power Amplifier Using Dynamic Power-Supply Voltage for CDMA Applications"; G. Hanington et al.; IEEE trans MTT, vol. 47, No. 8, pp. 1471-1476, 1999. August.

* cited by examiner

WAVEFORMS FOR ENVELOPE TRACKING TRANSMITTER

FIELD OF THE INVENTION

The present invention relates generally to a radio frequency transmitter and, more particularly, to an envelope-tracking transmitter.

BACKGROUND OF THE INVENTION

A digital cellular communication system uses an RF transmitter to modulate a radio carrier with the baseband coded data for transmission. The baseband coded data is a digitally modulated waveform. Through an I/Q modulator, the baseband data modulates a radio frequency (RF) carrier as set by a local oscillator. The transmitter also has a bandpass filter, such as an SAW or BAW device, to filter out spurious frequencies to reduce out-of-band noise, and a driver amplifier to strengthen the RF modulated signal. Finally, a power amplifier is used to convey the modulated signal to the antenna for transmission.

The efficiency of the power amplifier can be improved by modifying the power amplifier supply voltage in accordance with the envelope of the modulated RF signal. This technique is known as envelope tracking, and the power amplifier is also referred to as a dynamic supply voltage amplifier. Modification of the supply voltage can be carried out with an analog control or a digital control. As disclosed in Ranjan et al. ("Microwave Power Amplifiers with Digitally-Controlled Power Supply Voltage for High Efficiency and High Linearity", IEEE MTT-S International Microwave Symposium Digest, pp. 493-496, vol.2) and Hanington et al. ("High-Efficiency Power Amplifier Using Dynamic Power-Supply Voltage for CDMA Application", IEEE Trans MTT, vol. 47, No. 8, pp.1471-1476, 1999), a diode is coupled to the driver amplifier to detect the envelope of the RF modulated signal. The detected envelope, which is an analog signal, is then used to vary the supply voltage of the power amplifier. While this prior art envelope tracking technique significantly improves the efficiency of the power amplifier in an RF transmitter, it does not deal with the rapid gain and phase changes when the supply voltage is very low. Rapid phase changes result in high phase distortion, for example. It is possible, however, to compensate the rapid gain and phase changes by pre-distorting the I and Q signals going to the I/Q modulator. Ranjan et al. uses a digital signal processor to generate a voltage control based on the I and Q values. While this approach somewhat improves the efficiency of the power amplifier, it relies on a complicated algorithm for pre-distorting the I and Q values. However, both the digital approach and the analog approach, as disclosed in Ranjan et al., fail to address the problems associated with the transmit slot ramp-up and ramp-down between slots in the slotted operation in a mobile radio design, such as that in the TDMA and CDMA systems.

Thus, it is advantageous and desirable to provide a method and device for further improving the envelope tracking technique.

SUMMARY OF THE INVENTION

It is a primary object of the present invention to improve the linearity and efficiency of a power amplifier in a RF transmitter by keeping the amplifier in the linear and efficient operating point of each used power level. Ideally the operating point is such that when the output signal is close to the amplifier compression point, the efficiency is optimal. The signal should be below the amplifier compression point by a certain amount of back-off in order to maintain the linearity. The compression point is controlled by the supply voltage. In particular, the present invention improves the linearity and efficiency when the supply voltage to the power amplifier is low. Furthermore, the present invention provides a method and device to control the envelope in the ramp-up and ramp-down period in the Tx-slots so that the envelope increase in the ramp-up period and the envelope decrease in the ramp-down period are in a predefined form. Moreover, the present invention also improves the efficiency of a switching power supply, which is used to provide a supply voltage to the power amplifier.

Thus, according to the first aspect of the present invention, there is provided a method of improving the efficiency of a transmitter for transmitting information in a carrier frequency via an antenna, wherein the transmitter includes:

a signal processor for providing baseband data indicative of the information, a modulating mechanism, responsive to the baseband data, for providing a modulated signal in the carrier frequency indicative of the baseband data;

an amplifier, responsive to the modulated signal, for providing a transmission signal to the antenna for transmission;

a power supply for providing a supply voltage to the amplifier; and a computation means, responsive to the baseband data, for providing a waveform to the power supply for modifying the supply voltage, the waveform indicative of an envelope of the modulated signal. The method is characterized by modifying the waveform by imposing a lower limit thereto prior to providing the waveform to the power supply such that the supply voltage to the amplifier is always greater than a predetermined value.

According to the present invention, where the information is transmitted in a plurality of time slots, and wherein the time slots are started and ended by ramp periods containing no information in the carrier frequency, the method is further characterized by further modifying the waveform by providing a substantially constant signal thereto such that the supply voltage to the amplifier includes a substantially constant voltage level in the ramp periods.

Preferably, the substantially constant voltage level comprises a level computed based on a root-mean-square value of the waveform prior to said further modifying step.

Advantageously, the method is further characterized by providing a DC-offset to the waveform.

Advantageously, when the amplifier comprises a plurality of amplification stages, the supply voltage of one or more of the amplification stages can be modified by the waveform.

According to the second aspect of the present invention, there is provided a device for improving the efficiency of a transmitter system for transmitting information in a carrier frequency via an antenna, wherein the transmitter system includes:

a signal processor for providing baseband data indicative of the information;

a modulating mechanism, responsive to the baseband data, for providing a modulated signal in the carrier frequency indicative of the baseband data;

a transmitter, coupled to the antenna, for transmitting the information in the carrier frequency, wherein the transmitter comprises an amplifier, responsive to the modulated signal, for providing transmission signals to the antenna for transmission;

a power supply for providing a supply voltage to the amplifier; and a computation means, responsive to the baseband data, for providing a waveform to the power supply for modifying the supply voltage, the waveform indicative of an envelope of the modulated signal. The device characterized by means, responsive to the waveform, for imposing a lower limit to the waveform prior to providing the waveform to the power supply such that the supply voltage to the amplifier is always greater than a predetermined value.

Preferably, when the information is transmitted in a plurality of time slots started and ended by ramp periods containing no information in the carrier frequency, the device is further characterized by a power control means, responsive to the waveform, for modifying the waveform by providing a substantially constant signal thereto such that the supply voltage to the amplifier includes a substantially constant voltage level in the ramp periods.

Advantageously, the device is further characterized by means, responsive to the waveform, for providing a DC-offset to the waveform.

According to the present invention, wherein the transmitter system also transmits the information in a further carrier frequency different from the carrier frequency, and wherein the modulating mechanism is also capable of providing a further modulated signal in the further carrier frequency indicative of the baseband data, the transmitter system further comprising a further transmitter, coupled to the antenna, for transmitting the information in the further carrier frequency, the further transmitter comprising a further amplifier, responsive to the further modulated signal, for providing further transmission signals to the antenna for transmission, the device is further characterized in that the power supply also provides a further supply voltage to the further amplifier; and the computation means, based on the baseband data, also provides a further waveform indicative of an envelope of the further modulated signal to the power supply for modifying the further supply voltage.

Advantageously, the device is further characterized by means, responsive to the further waveform, for imposing a further lower limit to the further waveform prior to providing the further waveform to the power supply such that the further supply voltage to the further amplifier is always greater than a further predetermined value.

Advantageously, the device is further characterized by means, operative to the modulating mechanism, to select between the modulated signal and the further modulated signal for providing to the antenna either the transmission signals or the further transmission signals for transmission.

The present invention will become apparent upon reading the description taken in conjunction with FIGS. 1-5.

BEST MODE TO CARRY OUT THE INVENTION

Figure 1:
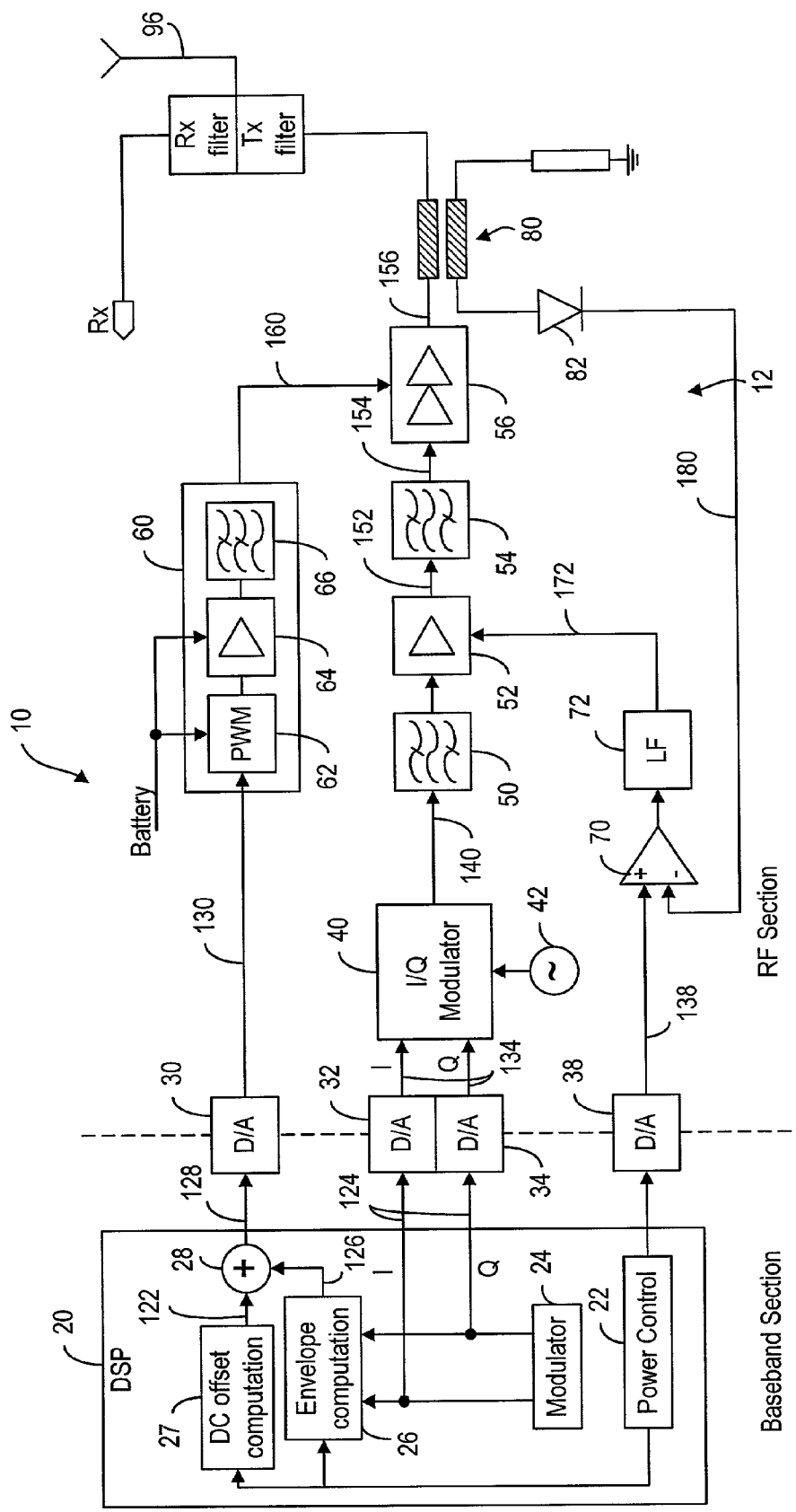
FIG. 1 is a block diagram showing an envelope tracking transmitter, according to the present invention.

The envelope tracking transmitter 10 of the present invention, is illustrated in FIG. 1. As shown, the baseband section of the transmitter 10 comprises a digital signal processor (DSP) 20 for generating digital baseband data (I, Q) 124. The digital baseband data 124 is converted by digital-to-analog converters 32, 34 into analog data 134, which is then superimposed onto a radio frequency (RF) carrier by an I/Q modulator 40. Frequency of the carrier signal is set by a local oscillator 42. The RF modulated data 140 is filtered by a band-pass filter 50 to remove spurious frequencies outside the carrier frequency band before the data is conveyed to a driver amplifier 52 to strengthen the RF modulated signal 140. Another band-pass filter 54 is used to further lower the noise floor in the output 152 of the driver amplifier 52, and the filtered signal 154 is conveyed to a power amplifier 56. The power amplifier 56 couples the amplified RF modulated signal 156 to an antenna 96 for transmission. At the same time, a supply voltage 160 is provided to the power amplifier 56 to modify the power supply voltage of the power amplifier 56. The aforementioned part of the transmitter is known in the art. The present invention is concerned with what waveform is used to modify the supply voltage 160 in order to improve the efficiency and linearity of the power amplifier 56.

Figure 2:
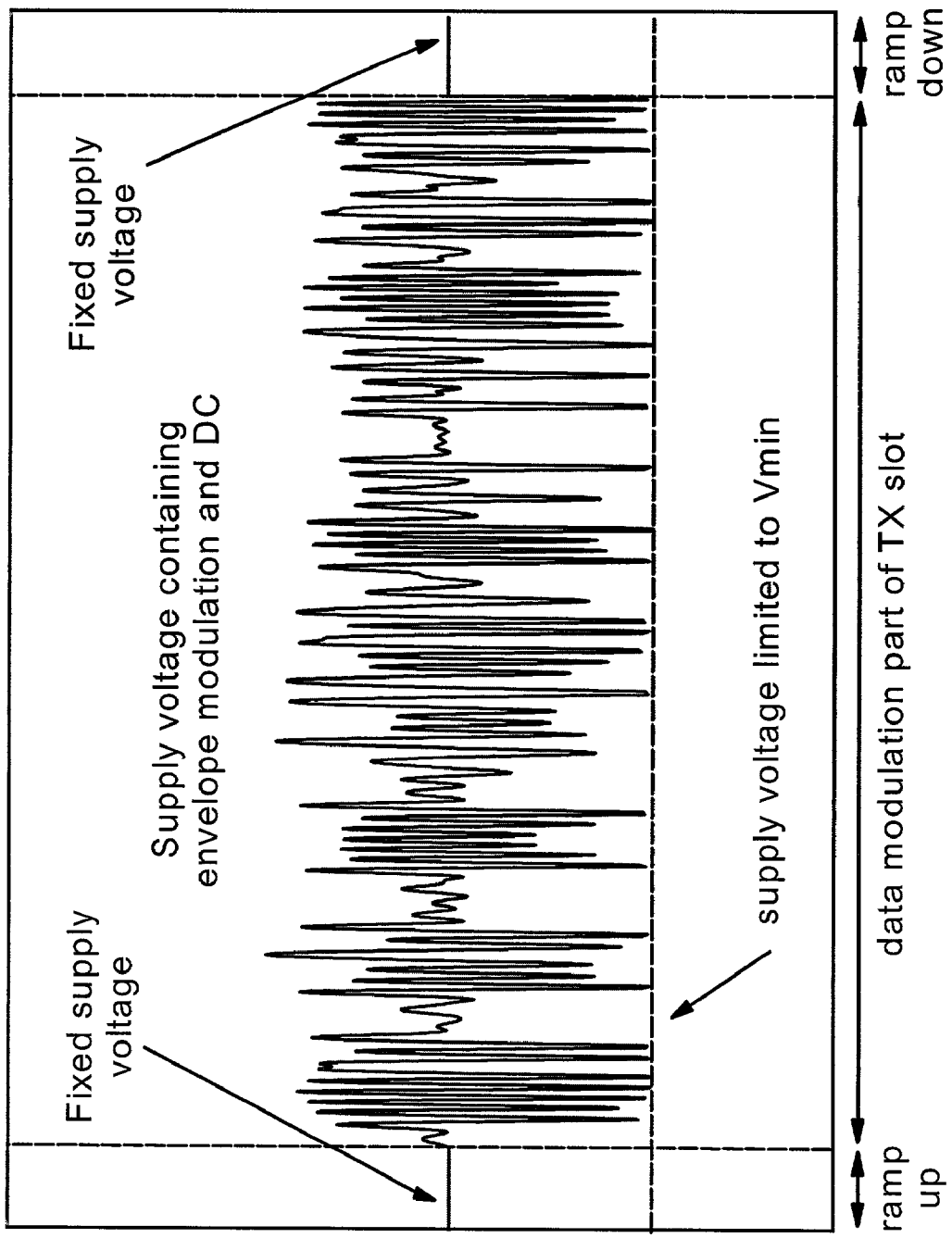
FIG. 2 is a plot showing an exemplary envelope tracking modulation waveform, according to the present invention.

As shown in FIG. 1, the DSP 20 includes a power control means 22, a modulator 24, an envelope computation means 26 and a summer 28. The envelope computation means 26 uses the I/Q data 124 to compute a digital envelope of the data to be transmitted. When the envelope is such that the modulated supply voltage 160 is less than a certain threshold (1 volt, for example), the envelope is clipped by the computation means 26. The reason for clipping is that when the supply voltage 160 is low, the power amplifier gain and phase change rapidly, resulting in high amplitude and phase distortion to the amplified RF modulated signal 156. Thus, it is advantageous and desirable to limit the minimum voltage on the power amplifier 56 to reduce amplitude and phase distortion. The clipped waveforms of the supply voltage, according to the present invention, are shown in FIG. 2.

Furthermore, the gain of the power amplifier 56 also varies with the RF input level in signals 154. In a slotted operation, the transmit slots can be separated by receive slots and idle slots as in a TDMA systems like DAMPS and EDGE, for example. Between those slots, there are ramp-up and ramp-down for the transmit slots. The signal envelope increases from 0 to a value depending on the desired output power during the ramp-up period of the transmit slots. Gain variations in these ramp periods may degrade the accuracy of the ramp shape and timing, which may cause spectrum spreading to adjacent channels.

Figure 3:
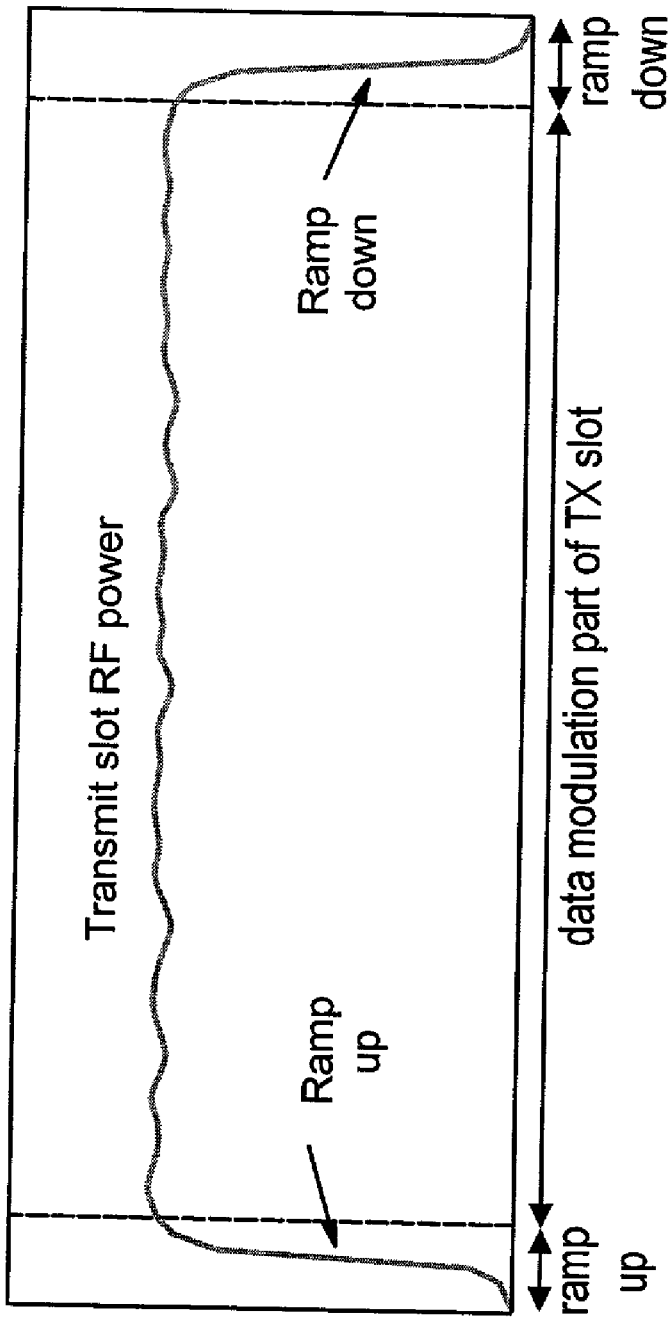
FIG. 3 is a plot showing the transmitter output power.

It is advantageous and desirable to control the envelope increase during the ramp-up period. According to the present invention, the modulated supply voltage 160 is kept at a constant level in the ramp-up period of the Tx-slot to ensure a fixed gain in the power amplifier, thereby increasing the envelope in a controlled manner. Similarly, the modulated supply voltage 160 is kept at a constant level in the ramp-down period of the Tx-slot, ensuring the ramp-down envelope decreases to zero in a predefined manner without abrupt changes. As shown in FIG. 2, the voltage supplied to the power amplifier 56 contains a data modulation part of the Tx-slot between a constant value in the ramp-up period and a constant value in the ramp-down period. Furthermore, in order to cause the power amplifier gain in the ramp-up and ramp-down periods to be in the same region as in the data modulation part of the Tx-slot, the constant value of the supply voltage 160 during the ramp periods is generated based on the RMS (root-mean square) value of the modulated supply voltage in the data modulation part of the Tx-slot. As such, there are no abrupt changes in the output signal 156 of the power amplifier 56 between the end of the ramp-up period and the start of the data section, and between the end of the data section and the start of the ramp-down period. As a result, there will be fewer glitches in those transition periods. A typical waveform of the output power of the power amplifier 56 is shown in FIG. 3.

The clipped envelope waveform, as generated by the computation means 26, is denoted by reference numeral 126. After being converted into an analog signal 130 by a digital-to-analog converter 30, the clipped waveform 126 is conveyed to a switching power supply 60 for providing the modulated supply voltage 160. Preferably, the bandwidth of the switching power supply 60 is greater than modulation symbol rate in the envelope waveform 126 so that the changes in the modulated supply voltage 160 follow the changes in the amplitude of the envelope waveform 130. However, a high bandwidth in the switching power supply 60 reduces the efficiency of the power supply 60, because the losses of the switching transistors in the power supply 60 increase with the switching frequency. In order to increase the efficiency of the switching power supply 60, it is advantageous to add DC-term to the envelope waveform 130 and to use reduced bandwidth in the switching power supply 60. As shown in FIG. 1, the DC-offset level 122, which is provided by a DC-offset computation means 27, is added to the envelope signal 126 by a summer 28. The summed signal 128 is converted from a digital waveform to an analog waveform by the converter 30. In the switching power supply 60, a pulse width modulator (PWM) 62 is used to digitize the analog envelope waveform 130 for amplification in a switch-mode amplifier 64. Finally a low-pass filter 66 produces the analog modulated supply voltage 160 for the power amplifier 56.

With the clipped envelope waveform, the envelope swing is further decreased because deep and sharp notches are also clipped. Because deep and sharp notches contain high frequency components, the decreased envelope swing requires less bandwidth from the switching power supply 60. Consequently, a lower clock frequency can be used, resulting in an improvement in efficiency of the switching power supply 60.

It should be noted that the digital signal 128 is converted to the analog form 130, which is converted back to the digital form by the pulse width modulator 62. Functionally, these conversion steps are unnecessary. Thus, the pulse width modulator 62 can be included in the baseband section for feeding the switch mode amplifier 64. As such, the digital-to-analog converter 30 is not necessary.

The power control means 22, as shown in FIG. 1, is used to provide transmit power level information to the DC-offset computation means 27 and the envelope computation module 26. The power control means 22 is also used to provide a voltage reference level 138, after being converted by a digital-to-analog converter 38, to an operational amplifier 70 in a power control loop 12 of the RF transmitter 10. The power control loop 12 includes a coupler 80 and an output detector 82 at the output of the power amplifier 56. The detected voltage 180 is compared to the reference level 138 for controlling the gain of the driver amplifier 52. A loop filter 72 is used to remove spurious signals in the loop. It should be noted that transmitter power control can also be carried out differently than the analog control loop 12. Transmitter power control is not part of the invention.

The RMS value of the envelope modulation 126 varies with the implementation of power amplifiers, linearity requirements and power levels. It can be measured and defined in the product development stage and stored in the memory of the mobile terminal digital baseband. For example, the memory can be included in the envelope computation means 26. Moreover, the DC-offset level 122 can vary from one slot to another if the desired transmitter output is different from one slot to another.

The present invention, as shown in FIG. 1, is applicable to digital mode transmitters, such as DAMPS, EDGE and CDMA systems. The present invention is also applicable to a multi-band transmission/reception system.

Figure 4:
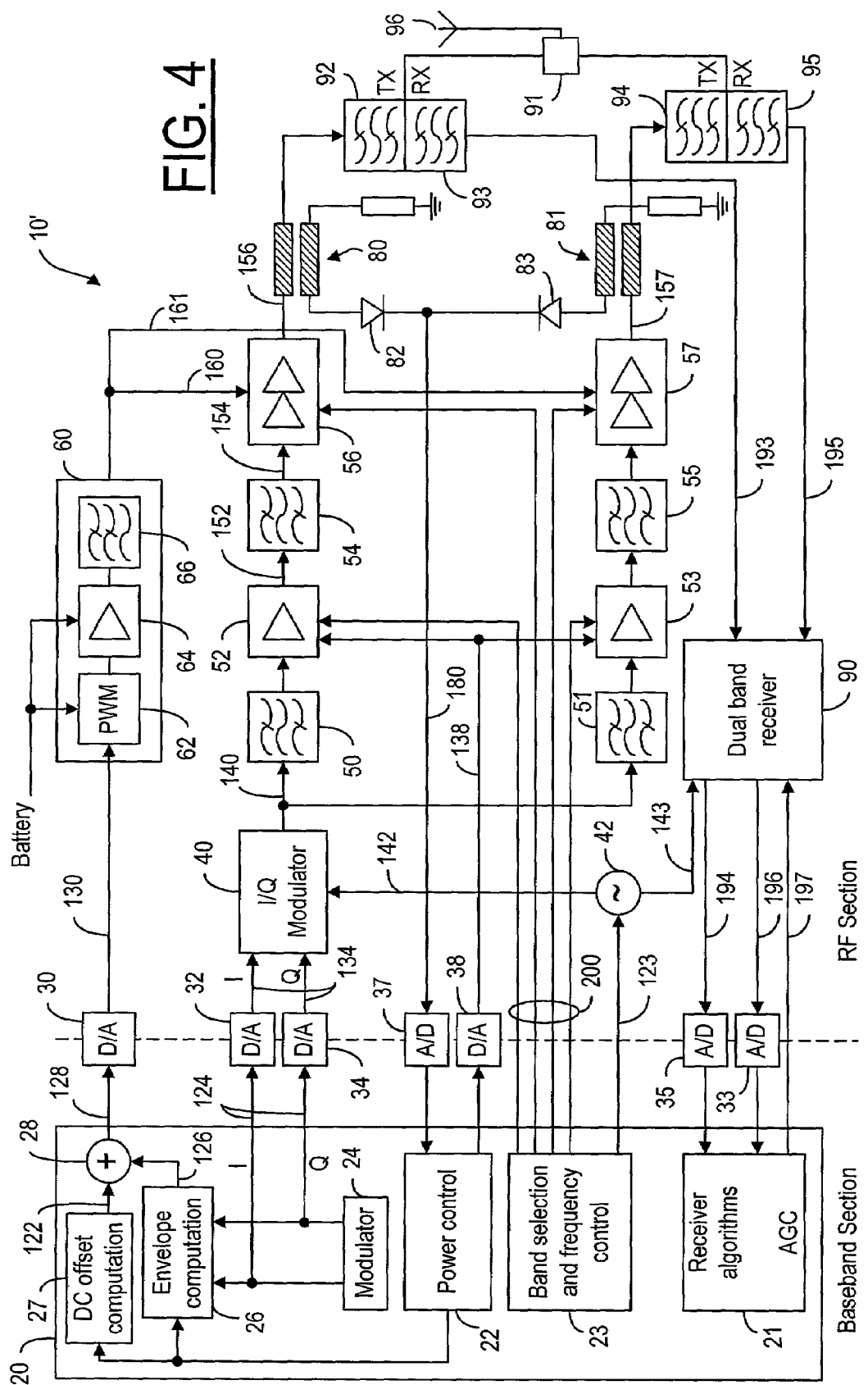
FIG. 4 is a block diagram showing an envelope tracking transmitter for use in a dual-band terminal, according to the present invention.

FIG. 4 is a block diagram showing an envelope tracking transmitter 10' for a dual-band mobile terminal. For example, the dual-band mobile terminal can operate in a TDMA system and a CDMA system. As shown, the transmitter 10' has two sets of filters (92, 93), (94,95) coupled to a common antenna 96 through a diplexer 91 for transmitting or receiving signals in different frequency bands. For transmission, a local oscillation (LO) signal 142 for RF carrier is generated by a frequency synthesizer 42 under a control signal 123 provided by a band selection and frequency control module 23. For reception, an LO signal 143 for down-conversion in a dual-band receiver 90 is generated by the frequency synthesizer 42 under the control of the control module 23. The dual-band receiver 90, includes a I/Q demodulator (not shown) to separate either the received signal 193 or signal 195 into its I and Q components 194, 196. These I and Q components are converted by A/D converters 33 and 35 and conveyed to block 21 for further processing. The block 21 includes an automatic-gain control (AGC) device to adjust the gain of the dual-band receiver 90 using a digital signal 197. The frequency in the LO signal 142 and in the LO signal 143 is generated based on the band in which the mobile terminal is operating. The LO signal 142 and the LO signal 143 may be generated differently or with the same oscillator for a band depending on whether or not the Tx and Rx slots overlap. For example, in a TDMA system where the Tx and Rx slots do not overlap, the LO signal 142 and the LO signal 143 can be generated with the same synthesizer using frequency hop between Rx and Tx slots. In a full duplex system, like CDMA, LO signals 142 and 143 need their own synthesizers to generate different frequencies for the transmitter and receiver blocks. Besides the synthesizer 42 and the dual-band receiver 90, the common parts in the transmitter 10' include a digital signal processor 20, an I/Q modulator 40 and a switching power supply 60. For providing transmit signals for two different bands, however, two separate sets of components are needed. As shown in FIG. 4, two bandpass filters 50, 54, a driver amplifier 52 and a power amplifier 56 are used for one band; and two band-pass filters 51, 55, a driver amplifier 53 and a power amplifier 57 are used for another band. Furthermore, samples of the transmitted RF signal for one band are detected by a detector 82 via a coupler 80, and samples for the other band are detected from the output 157 of the power amplifier 57 by a detector 83 via a coupler 81. However, the detected samples 180 are converted by a common A/D converter 37 for further processing in the power control block 22. Depending on the value of the detected samples 180 and the desired output power, the gain of the driver amplifier 52 or 53 is either increased or decreased, as indicated in signal 138, an analog form at the output of a D/A converter 38. Although the same switching power supply 60 is used to provide a supply voltage 160 to the power amplifier 56 and a supply voltage 161 to the power amplifier 57, the supply voltage 160 and the supply voltage 161 may not be the same. The supply voltage 160 and the supply voltage 161 vary with the envelope computation and the DC offset computation for each band. As shown in FIG. 4, the band selection and frequency control module 23 also provides signals, via enable lines 200, to selectively enable the driver amplifiers 52, 53 and power amplifiers 56, 57 for band selection.

It should be noted that depending on modulator performance and filtering characteristics of filters 92 and 94, it is possible to reduce the number of bandpass filters 50, 51, 54, 55, or to totally eliminate the use of these bandpass filters.

Figure 5:
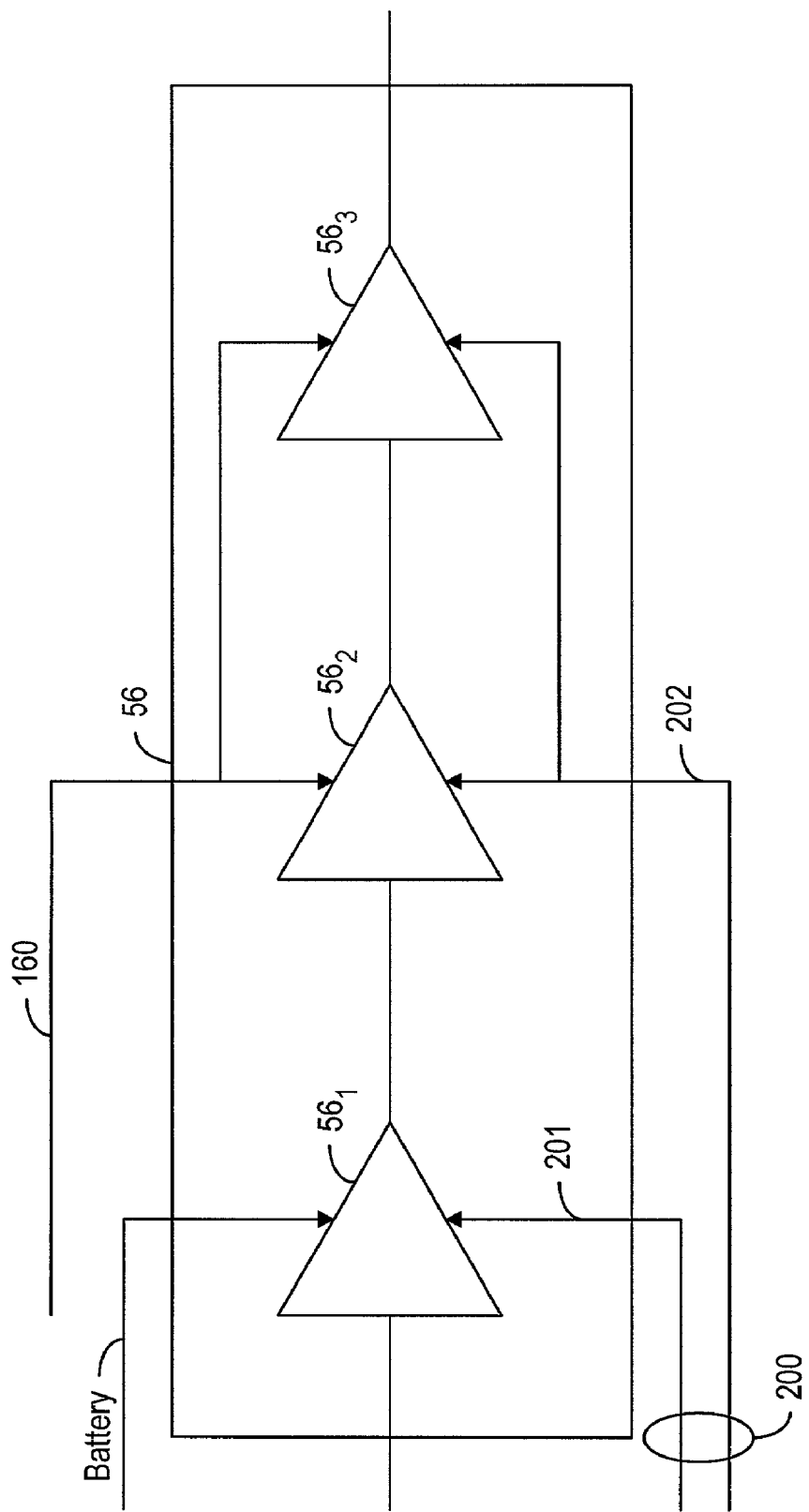
FIG. 5 is a block diagram showing a power amplifier with multiple amplification stages.

It should also be noted that in a transmitter where multiple power amplifier stages are used in conjunction with a single envelope tracking power supply 60, the supply voltage for one or more stages of the power amplifier can be modulated. In that case, the enable lines 200 also provide enable signals for selecting the stages and for which the voltage supply is modulated. For example, if the power amplifier 56 has a plurality of power amplification stages $56_1$, $56_2$ and $56_3$, as shown in FIG. 5, it is possible to modulate the supply voltage 160 for two stages $56_2$, $56_3$. Power amplifier 56 is activated using enable signals 201 and 202.

Thus, although the invention has been described with respect to a preferred embodiment thereof, it will be understood by those skilled in the art that the foregoing and various other changes, omissions and deviations in the form and detail thereof may be made without departing from the scope of this invention.

What is claimed is:

1. A method comprising:
   generating a modulated signal in a carrier frequency indicative of baseband data;
   providing a supply voltage for adjusting the modulated signal for providing a transmission signal for transmission in a transmitter for transmitting information, wherein the baseband data is indicative of the information;
   providing a voltage reference level for controlling a gain in said adjusting;
   modifying the supply voltage with a waveform indicative of an envelope of the baseband data; and
   imposing a lower limit to the waveform prior to providing the waveform for said modifying such that the supply voltage is always greater than a predetermined value, wherein said lower limit is computed at least partly based on transmit power level information, indicative of the voltage reference level.

2. The method of claim 1, wherein the baseband data is indicative of information transmitted in the carrier frequency in a plurality of time slots, and wherein the time slots are started and ended by ramp periods containing no information in the carrier frequency, said method further comprising
   further imposing a substantially constant signal to the waveform such that the supply voltage includes a substantially constant voltage level in the ramp periods.

3. The method of claim 2, wherein
   the substantially constant voltage level is computed based on the waveform prior to said further imposing.

4. The method of claim 2, wherein
   the substantially constant voltage level comprises a level computed based on a root-mean-square value of the waveform prior to said further imposing.

5. The method of claim 1, further comprising
   providing a direct current-offset to the waveform.

6. The method of claim 1, wherein said adjusting comprises a plurality of amplification stages, and wherein
   the supply voltage of one or more of the amplification stages is modified by the waveform.

7. A transmitter comprising:
   a signal processor for providing baseband data indicative of information for transmission;
   a modulating mechanism, responsive to the baseband data, for providing a modulated signal in a carrier frequency indicative of the baseband data;
   an amplifier, responsive to the modulated signal, for providing transmission signals for transmission;
   a power control module for providing a voltage reference level to the amplifier for controlling a gain of the amplifier and for providing transmit power level information;
   a power supply for providing a supply voltage to the amplifier;
   a computation module, responsive to the baseband data, for providing a waveform to the power supply for modifying the supply voltage, the waveform indicative of an envelope of the baseband data, wherein a lower limit is imposed to the waveform prior to providing the waveform to the power supply such that the supply voltage to the amplifier is always greater than a predetermined value, and wherein the lower limit is computed at least partly based on the transmit power level information provided by the power control module.

8. The transmitter of claim 7, wherein the information is transmitted in a plurality of time slots, and wherein the time slots are started and ended by ramp periods containing no information in the carrier frequency, wherein the power control module is adapted for modifying the waveform by providing a substantially constant signal thereto such that the supply voltage to the amplifier includes a substantially constant voltage level in the ramp periods.

9. The transmitter of claim 8, wherein
   the substantially constant voltage level comprises a level computed based on the waveform prior to said modifying.

10. The transmitter of claim 8, wherein
    the substantially constant voltage level comprises a level computed based on a root-mean-square value of the waveform prior to said modifying.

11. The transmitter of claim 7, further comprising a module for providing a direct current-offset to the waveform.

12. The transmitter of claim 7, transmitting the information in a further carrier frequency different from the carrier frequency, wherein
    the modulating mechanism is also capable of providing a further modulated signal in the further carrier frequency indicative of the baseband data, said transmitter further comprising a further amplifier, responsive to the further modulated signal, for providing further transmission signals for transmission, wherein
    the power supply also provides a further supply voltage to the further amplifier; and
    the computation module, based on the baseband data, also provides a further waveform indicative of an envelope of the baseband data to the power supply for modifying the further supply voltage.

13. The transmitter of claim 12, wherein a further lower limit is imposed to the further waveform prior to providing the further waveform to the power supply such that the further supply voltage to the further amplifier is always greater than a further predetermined value.

14. The transmitter of claim 12, further comprising
    a further module, operatively connected to the modulating mechanism, to select between the modulated signal and the further modulated signal for providing either the transmission signals or the further transmission signals for transmission.

15. The transmitter of claim 7, wherein the amplifier comprises a plurality of amplification stages, wherein
the supply voltage of one or more of the amplification states is modified by the waveform.

16. A transmitter for transmitting information comprising:
means, for providing baseband data indicative of the information;
means, responsive to the baseband data, for providing a modulated signal in a carrier frequency indicative of the baseband data;
means for amplifying the modulated signal for providing transmission signals for transmission;
means for controlling a gain of said amplifying means and for providing transmit power level information;
means, for providing a supply voltage to said amplifying means;
means, responsive to the baseband data, for providing a waveform to said voltage supplying means for modifying the supply voltage, the waveform indicative of an envelope of the baseband data, wherein a lower limit is imposed to the waveform prior to providing the waveform to said voltage supplying means such that the supply voltage to said amplifying means is always greater than a predetermined value, and wherein the lower limit is computed at least partly based on the transmit power level information, provided by said controlling means.

17. The transmitter of claim 16, wherein the information is transmitted in a plurality of time slots, and wherein the time slots are started and ended by ramp periods containing no information in the carrier frequency, wherein said controlling means is adapted for modifying the waveform by providing a substantially constant signal thereto such that the supply voltage to said amplifying means includes a substantially constant voltage level in the ramp periods.

* * * * *